(12) United States Patent
Butler

(10) Patent No.: US 7,847,919 B2
(45) Date of Patent: Dec. 7, 2010

(54) LITHOGRAPHIC APPARATUS HAVING FEEDTHROUGH CONTROL SYSTEM

(75) Inventor: Hans Butler, Best (NL)

(73) Assignee: ASML Netherlands B.V., Veldhoven (NL)

( * ) Notice: Subject to any disclaimer, the term of this patent is extended or adjusted under 35 U.S.C. 154(b) by 747 days.

(21) Appl. No.: 11/730,189

(22) Filed: Mar. 29, 2007

(65) Prior Publication Data

US 2008/0239264 A1    Oct. 2, 2008

(51) Int. Cl.
*G03B 27/42* (2006.01)
*G03B 27/58* (2006.01)
*G03B 27/62* (2006.01)
*G03B 27/32* (2006.01)

(52) U.S. Cl. .............................. 355/53; 355/72; 355/75; 355/77

(58) Field of Classification Search .................. 355/53, 355/52, 72, 75, 77; 356/399–401; 318/135; 708/300, 316; 310/12
See application file for complete search history.

(56) References Cited

U.S. PATENT DOCUMENTS

| | | | | |
|---|---|---|---|---|
| 5,402,400 A | * | 3/1995 | Hamada et al. | 360/78.06 |
| 5,696,590 A | * | 12/1997 | Makita | 356/399 |
| 5,841,250 A | * | 11/1998 | Korenage et al. | 318/135 |
| 6,359,688 B2 | * | 3/2002 | Akimoto et al. | 356/401 |
| 6,373,072 B1 | | 4/2002 | Butler et al. | |
| 6,727,977 B2 | * | 4/2004 | Butler | 355/53 |

* cited by examiner

*Primary Examiner*—Peter B Kim
*Assistant Examiner*—Christina Riddle
(74) *Attorney, Agent, or Firm*—Sterne, Kessler, Goldstein & Fox P.L.L.C

(57) ABSTRACT

An optical component of the lithographic apparatus is moved. A substrate support is moved so as to be synchronous with the motion of the optical component. A momentary position of the optical component is measured. A momentary position of the substrate support is measured at a first sampling rate. The measured momentary position of the optical component is compared with a desired momentary position of the optical component to generate an optical component position error signal in accordance with a difference between the two optical component positions. The measured momentary position of the substrate support is compared with a desired momentary position of the substrate support to generate a substrate support position error signal in accordance with a difference between the two substrate support positions. The momentary position of the optical component is adjusted so as to compensate for the difference between the two substrate support positions.

19 Claims, 8 Drawing Sheets

LITHOGRAPHIC APPARATUS HAVING FEEDTHROUGH CONTROL SYSTEM

BACKGROUND

1. Field

The present invention relates to a lithographic apparatus having a feedthrough control system, and a method for manufacturing a device.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The manufacture of ICs and other devices with a lithographic apparatus generally involves the replication of extremely fine sub-micron patterns, with an exceptionally high degree of positional accuracy. For this reason, it is desirable to properly isolate various critical parts of the apparatus (such as the substrate table (substrate support) and mask table (patterning support), for example) from spurious motion, vibration, mechanical shocks, etc. In general, this is achieved using such measures as carefully designed metrology frames, air-mounts, motional counterweights and dampers, which serve to isolate the critical parts of the apparatus from most unwanted mechanical influences. However, such measures are not completely effective in eliminating a number of unwanted influences, such as, for example:

1. vibrations in the substrate table due to leveling actions during exposure;
2. vibrations caused by motion of reticle masking blades;
3. resonance effects caused by the presence of air showers;
4. vibrations in the substrate support caused by motion of the patterning support, and vice versa; and
5. influence of air shower flow on the substrate support.

Although these effects are relatively small, they become increasingly important as the need to produce ever-higher device resolutions increases, and they form a substantial barrier to the viable realization of large-area ICs having critical dimensions of the order of 0.05 μm or less.

Accordingly, it has been proposed in U.S. Pat. No. 6,373,072, which is incorporated by reference herein, to provide a control system for the substrate and patterning supports of a lithographic apparatus in which errors in the position of the substrate support are compensated for by their inclusion as a feedforward control in the patterning support control loop. Specifically, the substrate support error is low-pass filtered, and the output of the filter is then added to the patterning support setpoint. The substrate support error is also twice differentiated, and multiplied by the patterning support mass, and the resultant force is applied to the patterning support. The proposal of this prior art is based on the realization that the absolute positions of the patterning and substrate supports are less important than their relative position and allows the correction of substrate support errors beyond the patterning support bandwidth. However, this control system has performance limits.

A major limitation in the achievable performance of the known control system is the delay in the feedthrough path processing the substrate support error, as is illustrated with reference to FIGS. 2 and 3.

FIGS. 2 and 3 schematically illustrate a prior art feedforward control system constructed and arranged to control movement of a patterning support MT for a patterning device MA by reference to a measured state of the substrate support WT, where a radiation beam patterned by the patterning device MA passes through a projection system PS to reach a substrate W.

The arrangement shown in FIG. 2 includes a measurement system 2 configured to measure the state (e.g., position, velocity, acceleration and/or further time derivatives of the position) of the substrate support WT. A feedforward control system 4 is provided for controlling the movement of the patterning support MT via force actuator 6. The control system 4 will be described in more detail below. Connections within control system 4 are illustrated in FIG. 3. The position of the patterning support MT may be measured using a measurement system 8. Each measurement system 2, 8 may include an interferometer.

FIG. 3 shows a block diagram illustrating the principles underlying the feedforward control system 4 of FIG. 2. A top control loop 20 represents the patterning support MT (or reticle stage RS) including a mechanical transfer $H_{RS}$ and controller $C_{RS}$. A bottom control loop 22 represents the substrate support WT (or wafer stage WS), including the mechanical transfer $H_{WS}$ and controller $C_{WS}$. Each of the control loops 20 and 22 include a feedback loop 24, 26, respectively, feeding back a measurement of the respective patterning support position $y_{RS}$ and the substrate support position $y_{WS}$ to the inputs of the respective control loops 20, 22. The mechanical transfers $H_{RS}$ and $H_{WS}$ include all aspects of a transfer function from a force generated by the respective controllers $C_{RS}$, $C_{WS}$, to an actual movement of the respective patterning support MT and substrate support WT. However, in the bottom control loop 22 a block IFM is shown explicitly to indicate that the mechanical transfer $H_{WS}$ includes (part of) a position measurement system, e.g. an interferometer (IFM) system, to determine the substrate support position $y_{WS}$, having a sampling frequency of e.g. 20 kHz and a data output frequency of e.g. 5 kHz. A similar position measurement system may be included in the mechanical transfer $H_{RS}$ of the top control loop 20 to determine the patterning support position $y_{RS}$. Between the bottom control loop 22 and the top control loop 20, a feedthrough path is provided.

The top control loop 20 of the patterning support MT receives L times a position setpoint SP POS of the bottom control loop 22 of the substrate support WT, while its output only counts 1/L in the relevant WS/RS error $e_{WRS}$, reflecting the fact that a pattern image is projected by the projection system PS with a magnification 1/L, and that the patterning support MT scans at L times the speed of the substrate support WT. For example, L may have a value between 3 and 6, e.g. 4.

The control system is arranged to feed an error $e_{WS}$ (defined as the difference between an external setpoint SP POS and a measured position $y_{WS}$ of the substrate support WT) from the substrate support control loop 22 to the patterning support control loop 20 by means of two signal branches 30 and 32. The first branch 30 is configured to multiply error $e_{WS}$ by a factor K in a stage 34. The factor K may be arranged to be proportional to the projection system magnification (in this case L times) in order to create a movement of the patterning support MT that is L times as large as that of the substrate support WT. In addition, also in stage 34, low-pass filtering by a filter 1/D is applied. The second branch 32 is arranged to doubly differentiate the substrate support control error $e_{WS}$, in a stage 36, in order to create a required acceleration of the patterning support MT. Stage 36 is then configured to multiply this acceleration by the patterning support mass m and the factor K and, finally, apply the same low-pass filtering 1/D that was applied in stage 34 of branch 30. The design is such that movement of the patterning support MT as a reaction to the feedforward branch 32 is such that it matches the addition to the input of the patterning support control loop 20, the output of stage 34.

In other words, the second branch 32 is configured to calculate the required force on the patterning support MT such that it moves in accordance with the signal from the first branch 30 added to the position setpoint SP POS. The aim of this arrangement is to ensure that the control error $e_{RS}$ of the patterning support remains zero. When applied on its own, the controller $C_{RS}$ would consider the force from the second branch 32 a disturbance, and would react and try to diminish the effect of the feedforward. By additionally feeding the filtered error $e_{WS}$ to the patterning support controller $C_{RS}$, this problem is solved. Now, if the patterning support MT reacts to the extra feedforward force as a transfer $1/ms^2$, the error $e_{RS}$ remains zero and hence the controller $C_{RS}$ is left "unaware" of any extra force injection.

The feedthrough path, including the branches 30 and 32, to the actual measured displacement $y_{RS}$ suffers from a delay. A minimum delay of 1.5 samples in the digital signal processing occurs in the path from $e_{WS}$ to the patterning support response (in reality it is closer to 2 samples). One sample thereof is caused by the double differentiation in the feedforward path (branch 32). This can be seen when considering the digital form of differentiation of a position signal. A first derivative v(k), velocity at a time k, is calculated as:

$$v(k) = \frac{1}{T_S}(e(k) - e(k-1))$$

and a second derivative a(k), acceleration at a time k, is calculated as:

$$a(k) = \frac{1}{T_S^2}(e(k) - 2e(k-1) + e(k-2))$$

Here, $T_s$ is a sampling time period, and e(k) is the signal that needs to be differentiated. As the calculation of derivatives uses past data, the calculated derivative lags behind the actual derivative by 0.5 sample for a first derivative v(k), and 1 sample for a second derivative a(k). The other 0.5 sample occurs due to the zero-order hold in the patterning support control loop 20 (more particularly, $H_{RS}$). This delay stems from the fact that the controller output will remain on digital-to-analog converters for a complete sample period, and hence the average data age is 0.5 sample. More delay is caused by calculation time needed in the controllers $C_{RS}$ and $C_{WS}$, and some additional filtering, which is not discussed in detail here. This means that the patterning support response to the substrate support position error $e_{WS}$ lags behind at least 1.5 samples, and hence the correction provided by the feedthrough is out of phase with regard to the substrate support position error $e_{WS}$. Especially for higher frequencies this effect reduces the performance of the lithographic apparatus.

It is to be noted here that the patterning support holds a patterning device, which is an optical component, i.e. a component which is part of an optical system of a lithographic apparatus. Accordingly, any control of a positioning of the patterning support as described above may equally or additionally be applied to a positioning of another optical component of the optical system of the lithographic apparatus, achieving the same or similar effects. Therefore, any reference in this specification to positioning a patterning support is equally or additionally valid as a reference to positioning an optical component of the lithographic apparatus, such as a part of an illuminator or a projection system.

Applying the prior art feedthrough control, as an indication of the average position error of a point on the substrate during an exposure time, MA (Moving Average) error, may be improved by a factor of about two. An image contrast loss (fading) expressed as an MSD value (Moving Standard Deviation), may only be improved slightly.

SUMMARY

It is desirable to reduce the delay in the feedthrough path of the control system.

In an embodiment of a the invention, a lithographic apparatus includes an illumination system configured to condition a radiation beam; a patterning support constructed and arranged to hold a patterning device, the patterning device being capable of imparting the radiation beam with a pattern in its cross-section to form a patterned radiation beam; a substrate support constructed and arranged to hold a substrate; a projection system constructed and arranged to project the patterned radiation beam onto a target portion of the substrate; a first driving device constructed and arranged to move an optical component of the lithographic apparatus; a second driving device constructed and arranged to move the substrate support so as to be synchronous with the motion of the optical component; a first position measuring device constructed and arranged to provide a momentary position of the optical component; a second position measuring device constructed and arranged to provide a momentary position of the substrate support at a first sampling rate; an optical component position comparator constructed and arranged to compare the measured momentary position of the optical component with a desired momentary position of the optical component to generate an optical component position error signal in accordance with a difference between the two optical component positions; a substrate support position comparator constructed and arranged to compare the measured momentary position of the substrate support with a desired momentary position of the substrate support to generate a substrate support position error signal in accordance with a difference between the two substrate support positions; and a correcting device constructed and arranged to adjust the momentary position of the optical component so as to compensate for the difference between the two substrate support positions.

In another embodiment of the invention, a device manufacturing method includes projecting a patterned beam of radiation onto a target portion of a substrate in a lithographic apparatus, the method further including moving an optical component of the lithographic apparatus; moving a substrate support so as to be synchronous with the motion of the optical component; measuring a momentary position of the optical component; measuring a momentary position of the substrate support at a first sampling rate; comparing the measured momentary position of the optical component with a desired momentary position of the optical component to generate an optical component position error signal in accordance with a difference between the two optical component positions; comparing the measured momentary position of the substrate support with a desired momentary position of the substrate support to generate a substrate support position error signal in accordance with a difference between the two substrate support positions; and adjusting the momentary position of the optical component so as to compensate for the difference between the two substrate support positions.

In an embodiment of the invention, the adjustment includes adding a position error signal, generated from the substrate support position error signal, to the optical component position error signal; adding a force to the optical component creating a motion to match the addition of the position error signal to the optical component position error signal, wherein: at substantially non-constant velocity of the substrate support, the force is generated from the substrate support position error signal; and at substantially constant velocity of the substrate support, the force is generated from the momentary position of the substrate support measured at a second sampling rate higher than the first sampling rate.

In another embodiment of the invention, the adjustment includes: adding a position error signal, generated from the substrate support position error signal, to the optical component position error signal; adding a force to the optical component creating a motion to match the addition of the position error signal to the optical component position error signal, wherein: at frequencies determined by low-pass filtering, the force is generated from the substrate support position error signal; and at frequencies determined by a high-pass filter, the force is generated from the momentary position of the substrate support measured at a second sampling rate higher than the first sampling rate.

In an embodiment, the low-pass filter and the high-pass filter have complementary filter characteristics.

In an embodiment, at least one of an order, a cut-off frequency and a damping is the same for the low-pass filter and the high-pass filter.

In another embodiment of the invention, the adjustment includes: adding a position error signal, generated from the substrate support position error signal, to the optical component position error signal; adding a force to the optical component creating a motion to match the addition of the position error signal to the optical component position error signal, wherein: at substantially non-constant velocity of the substrate support, the force is generated from the substrate support position error signal; and at substantially constant velocity of the substrate support, the force is generated from a measured momentary acceleration of the substrate support.

In another embodiment of the invention, the adjustment includes: adding a position error signal, generated from the substrate support position error signal, to the optical component position error signal; adding a force to the optical component creating a motion to match the addition of the position error signal to the optical component position error signal, wherein: at frequencies determined by a low-pass filter, the force is generated from the substrate support position error signal; and at frequencies determined by a high-pass filter, the force is generated from a measured momentary acceleration of the substrate support.

In another embodiment of the invention, the adjustment includes: adding a position error signal, generated from the substrate support position error signal, to the optical component position error signal; adding a force to the optical component creating a motion to match the addition of the position error signal to the optical component position error signal, wherein the force is determined by comparing a measured momentary acceleration of the substrate support with a desired momentary acceleration of the substrate support to generate a substrate support acceleration error signal in accordance with a difference between the two substrate support accelerations.

In an embodiment of the invention, there is provided a computer product having machine executable instructions, the instructions being executable by a machine to perform at least one of the above methods.

In an embodiment of the invention, there is provided a data carrier containing computer code containing computer instructions for a motion computer system of a lithographic apparatus to perform at least one of the above methods.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
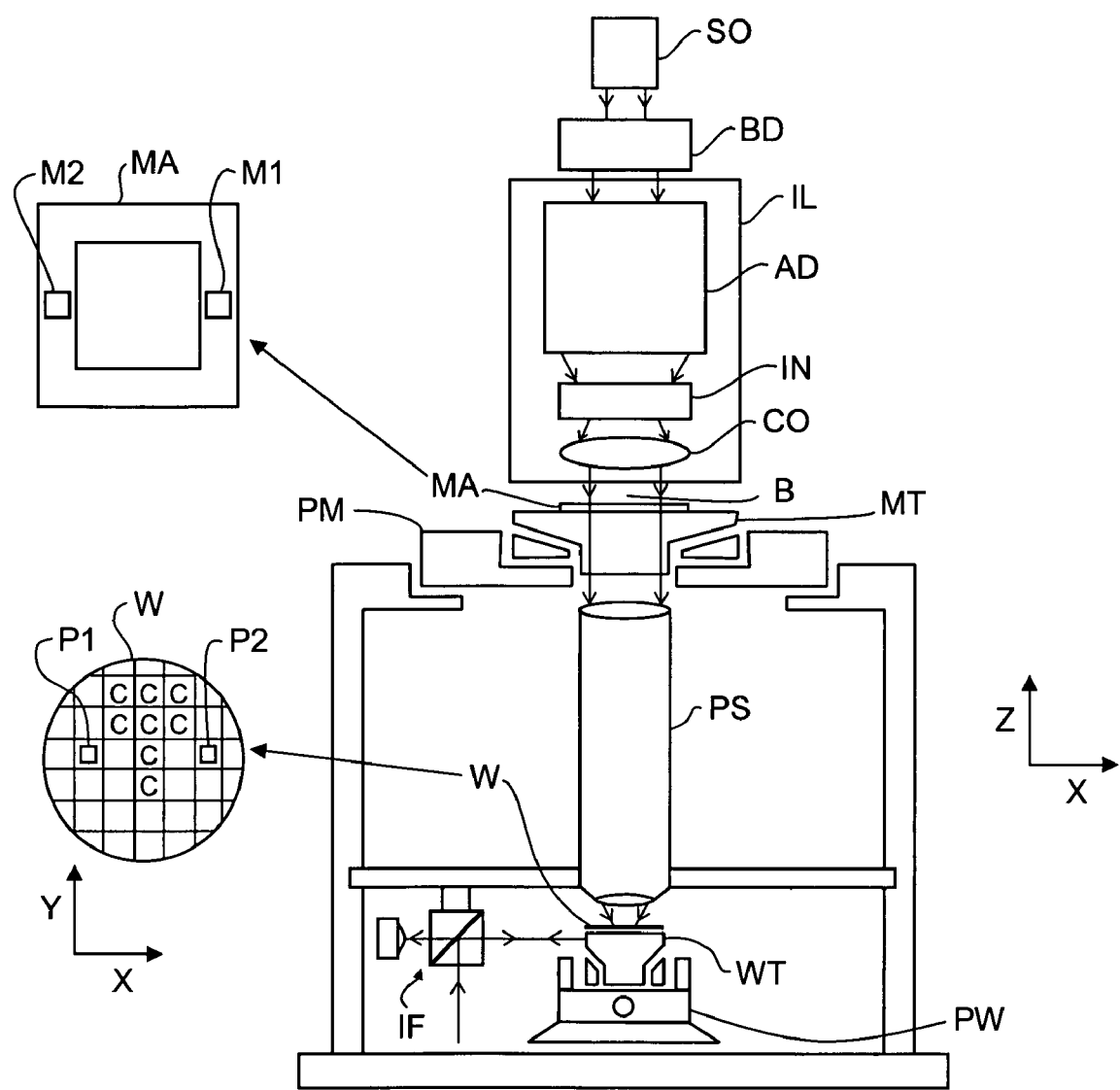
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning support (e.g. a mask table) MT constructed to support a patterning device (e.g. a mask) MA and connected to a first positioning device PM configured to accurately position the patterning device in accordance with certain parameters. The apparatus also includes a substrate support (e.g. a wafer table or substrate table) WT constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W. The first and second positioning devices PM and PW may also be termed, respectively, first and second driving devices. The lithographic apparatus also includes a first position measuring device constructed and arranged to provide a momentary position of the patterning device and a second position measuring device constructed and arranged to provide a momentary position of the substrate support. The second position measuring device may provide a momentary position of the substrate support at a first sampling rate.

The illumination system may include various types of optical components, such as refractive, reflective, magnetic, electromagnetic, electrostatic or other types of optical components, or any combination thereof, for directing, shaping, or controlling radiation.

The patterning support, or mask support structure, supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask support (structure) s" or "patterning supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure or patterning support (e.g., mask table MT), and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. A control system for the first positioning device PM and the second positioning device PW will be described in detail below. In general, movement of the patterning support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the patterning support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the mask table MT or "mask support" or "patterning support", and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" or "patterning support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" or "patterning support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" or "patterning support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 3:
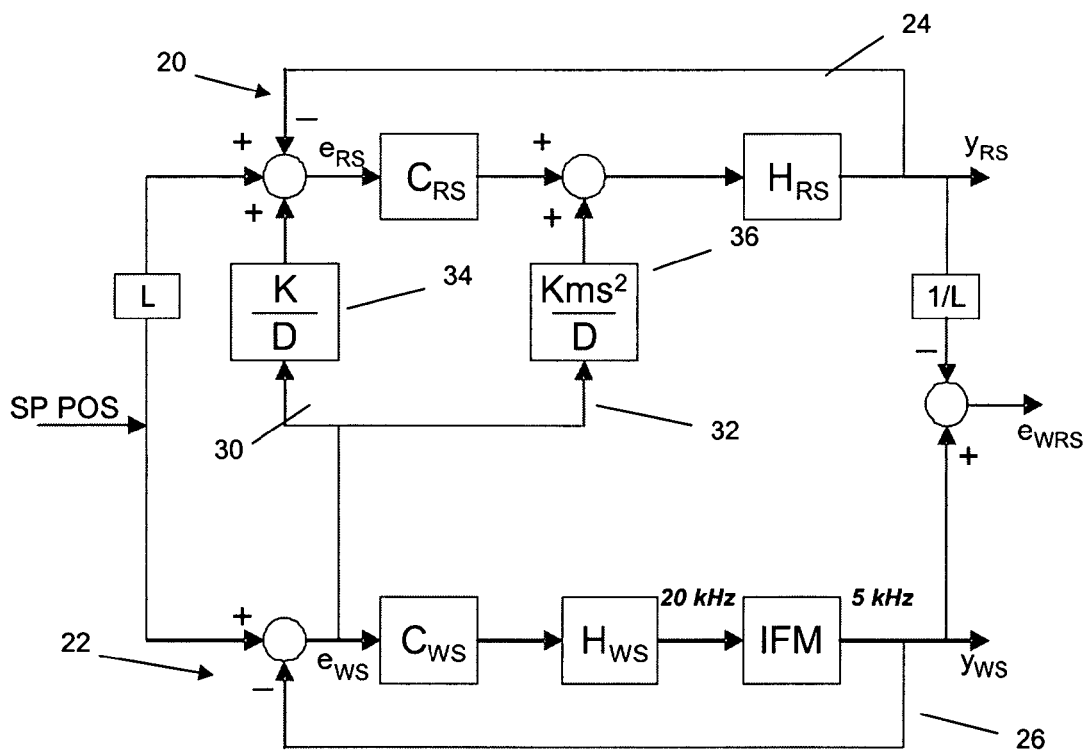
FIG. 3 depicts a block diagram of a prior art substrate and patterning support control system to be used in the lithographic apparatus of FIG. 2.
Figure 4:
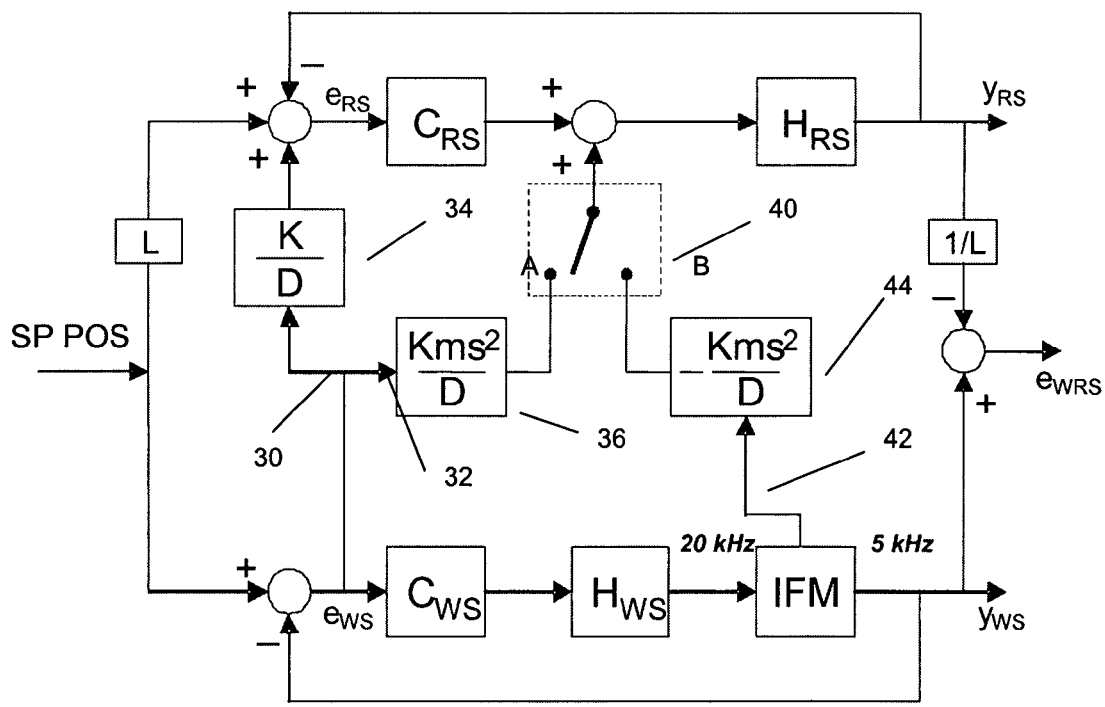
FIG. 4 depicts a block diagram of a substrate and patterning support control system according to an embodiment of the present invention.

Referring to FIG. 4, a lithographic apparatus according to an embodiment of the present invention includes a control system, which differs from the prior art control system depicted in FIG. 3 in that now, among other things, a switch 40 is used to select either the original branch 32 using the substrate support position error $e_{WS}$ and generating an accelerating force for the patterning support MT through the stage 36 having a transfer function $Kms^2/D$ (switch position A), or an additional branch 42 using a high frequency (e.g. 20 kHz) signal from the substrate support position measurement system IFM and generating an accelerating force for the patterning support MT through a stage 44 having a transfer function $-Kms^2/D$ (thus differentiating the absolute position measured in the position measurement system IFM) (switch position B). It is noted that the minus sign in the transfer function of the stage 44 is to compensate the sign difference between an acceleration error and absolute acceleration as provided by the stage 44.

Figure 2:
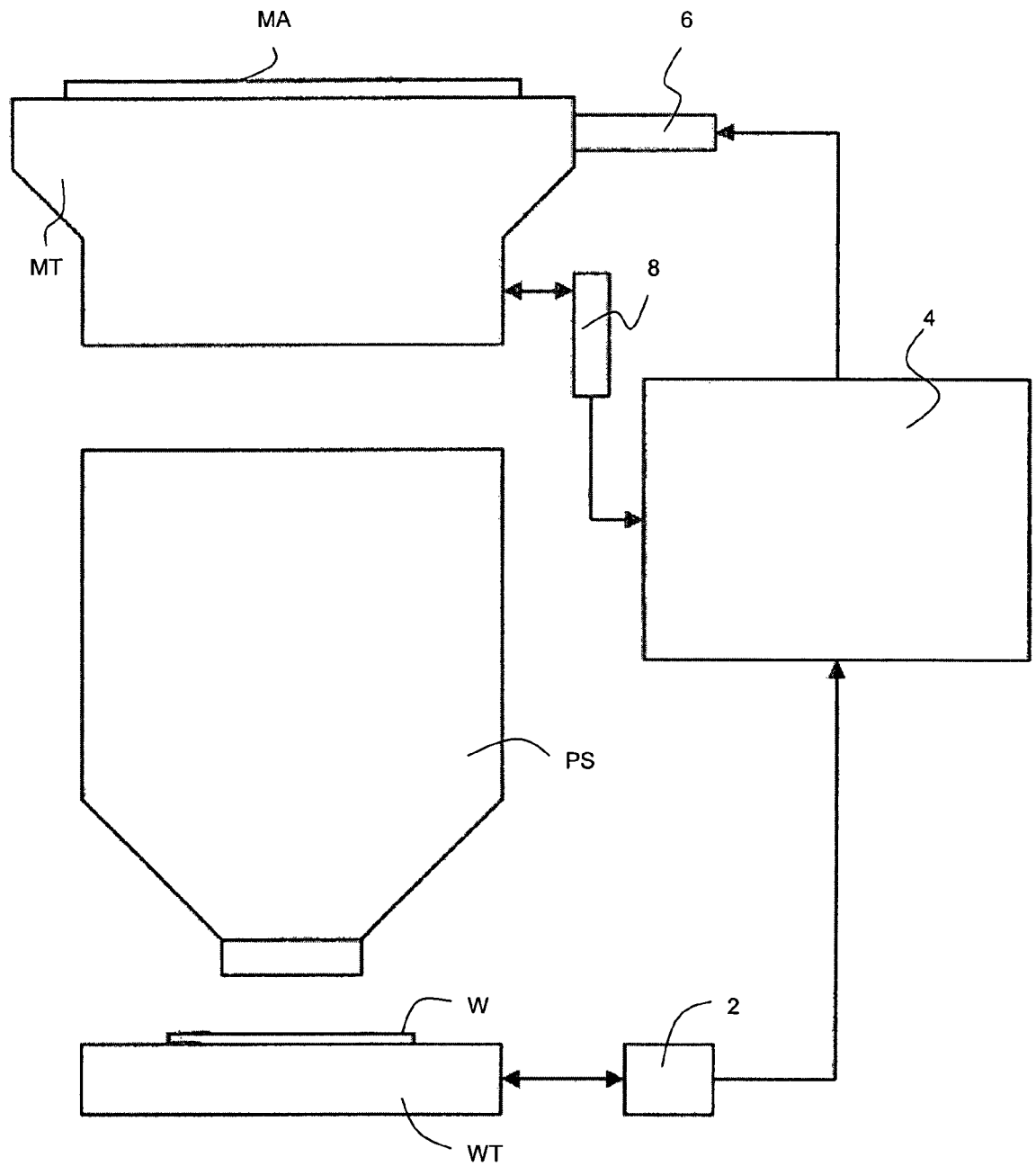
FIG. 2 schematically depicts a part of a lithographic apparatus for explaining a substrate and patterning support control system according to the prior art.

In the following, the description will focus on inventive aspects of the control system, and for more general aspects of the control system reference is made to the description of FIGS. 2 and 3 above.

In the embodiment of FIG. 4, the switch may be implemented as a software switch, where the switch position is determined by software depending on a condition of the lithographic apparatus, more in particular an operating condition of the substrate support WT.

Figure 9:
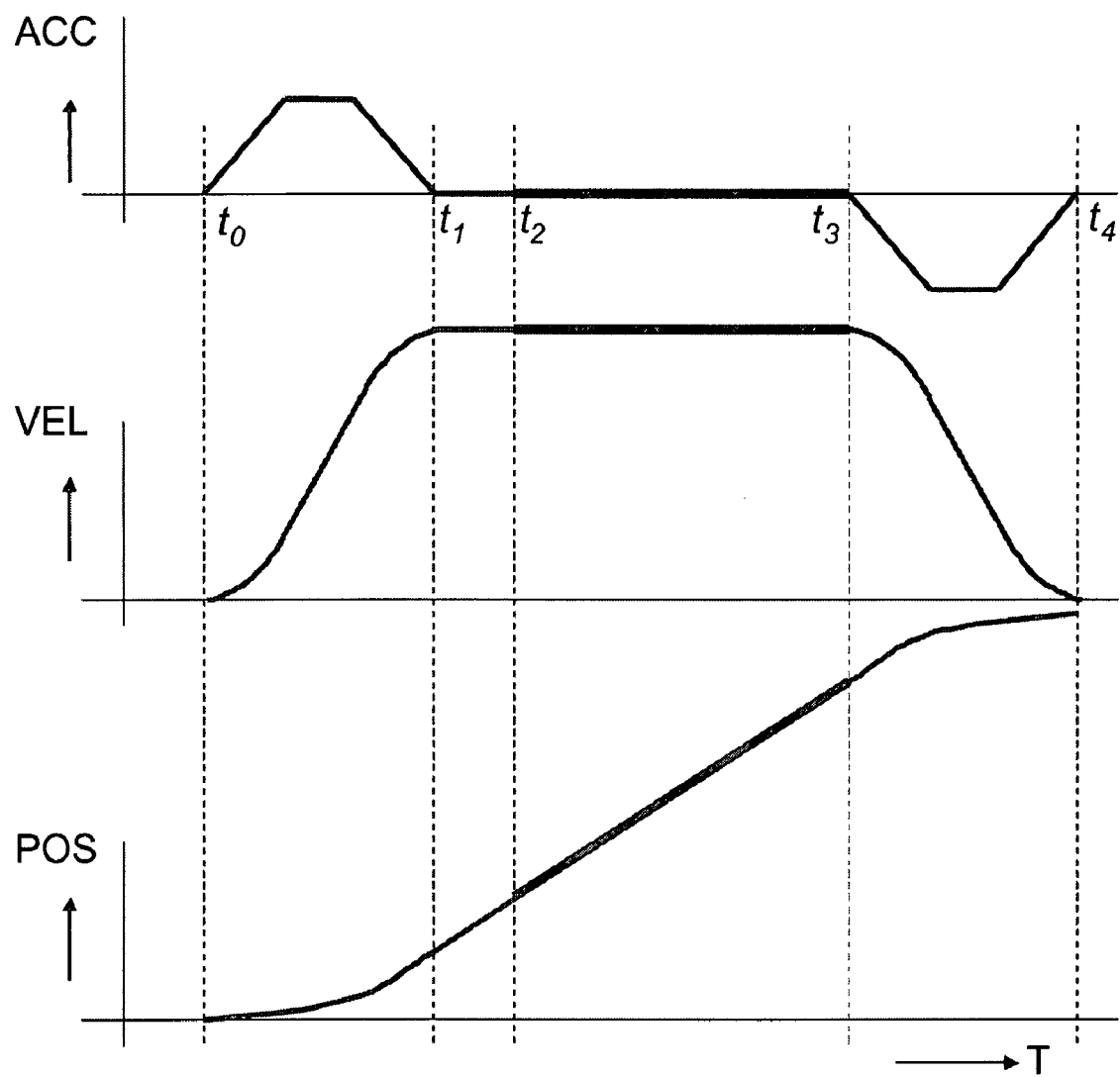
FIG. 9 depicts a position, velocity and acceleration of a substrate support or a patterning support as a function of time for aiding the explanation of several embodiments of the present invention.

FIG. 9 illustrates various operating conditions of the substrate support WT. In the lower graph, a position POS of the substrate support WT with respect to a fixed reference point is depicted in time T. In the middle graph, the corresponding velocity VEL of the substrate support WT is depicted in time T. In the upper graph, the corresponding acceleration ACC of the substrate support WT is depicted in time T. When accelerating the substrate support WT in a first direction in a first time period between times $t_0$ and $t_1$, the substrate support velocity increases from zero to a desired value, and the position of the substrate support WT changes. In a subsequent second time period between times $t_1$ and $t_2$, the movement of the substrate support WT settles, and the velocity becomes substantially constant. In a subsequent third time period between times $t_2$ and $t_3$, a target portion of a substrate held by the substrate support WT is scanned, the acceleration being zero, and thus the velocity being substantially constant, in the third time period. In a subsequent fourth time period between times $t_3$ and $t_4$, the substrate support WT is accelerated in a second direction opposite to the first direction (or decelerated) such that the velocity becomes zero again.

In the embodiment of FIG. 4, the position B of the switch 40 is used at least in the third time period, and possibly in the second time period (at substantially constant velocity of the substrate support WT), whereas the position A of the switch 40 is used in other time periods. Using the high-frequency position signal from the measurement system IFM through the branch 42 and the stage 44 in the position B of the switch 40 considerably reduces the delay in adding the force to the patterning support MT to match the signal from the branch 30 added to the patterning support position error signal $e_{RS}$.

Figure 5:
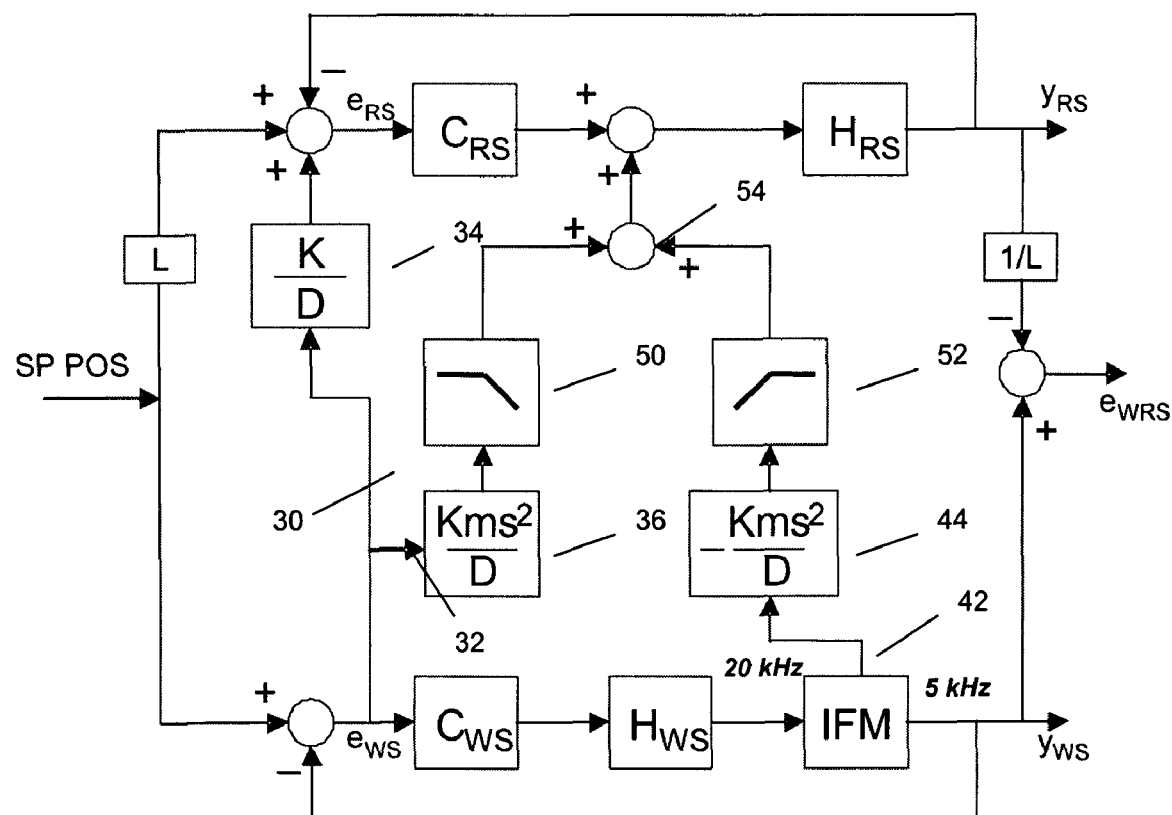
FIG. 5 depicts a block diagram of a substrate and patterning support control system according to an embodiment of the present invention.

Referring to FIG. 5, a lithographic apparatus according to an embodiment of the present invention includes a control system, which differs from the control system depicted in FIG. 4 in that, among other things, the switch 40 of FIG. 4 has been implemented in FIG. 5 by a combination of a low-pass filter 50 and a high-pass filter 52 both having their output coupled to an adder 54. For lower frequencies, the original branch 32 using the substrate support position error $e_{WS}$ and generating an accelerating force for the patterning support MT through the stage 36 having a transfer function $Kms^2/D$ is substantially active, and an additional branch 42 using a high frequency (e.g. 20 kHz) signal from the substrate support position measurement system IFM and generating an accelerating force for the patterning support MT through a stage 44 having a transfer function $-Kms^2/D$ (thus differentiating the absolute position measured in the position measurement system IFM) is substantially inactive. For higher frequencies, the original branch 32 using the substrate support position error $e_{WS}$ and generating an accelerating force for the patterning support MT through the stage 36 having a transfer function $Kms^2/D$ is substantially inactive, and an additional branch 42 using a high frequency (e.g. 20 kHz) signal from the substrate support position measurement system IFM and generating an accelerating force for the patterning support MT through a stage 44 having a transfer function $-Kms^2/D$ is substantially active. Thus, in the embodiment of FIG. 5, the use of the signal $e_{WS}$ and the absolute position signal from the position measurement system IFM are switched in the frequency domain.

In the embodiment of FIG. 5, high-pass filter 52 filters out the generally low-frequent component caused by the acceleration profile in the absolute acceleration signal as generated by stage 44. Since stage 44 generates a representation of the absolute acceleration as opposed to the acceleration error, it contains the acceleration as caused by the scanning motion that the substrate table WT executes. This part of the acceleration should not be transferred to the patterning support MT, and is filtered by high-pass filter 52. Low-pass filter 50 is selected to be a complement of high-pass filter 52. An order, cut-off frequency and damping of the low-pass filter 50 are substantially the same as those of high-pass filter 52. By this selection, zero phase error is introduced in the overall path of the acceleration feedforward to the patterning support MT. Using the high-frequency position signal from the measurement system IFM through the branch 42 and the stage 44 considerably reduces the delay in adding the force to the patterning support MT to match the signal from the branch 30 added to the patterning support position error signal $e_{RS}$, because the delay is especially critical for higher frequencies.

Figure 6:
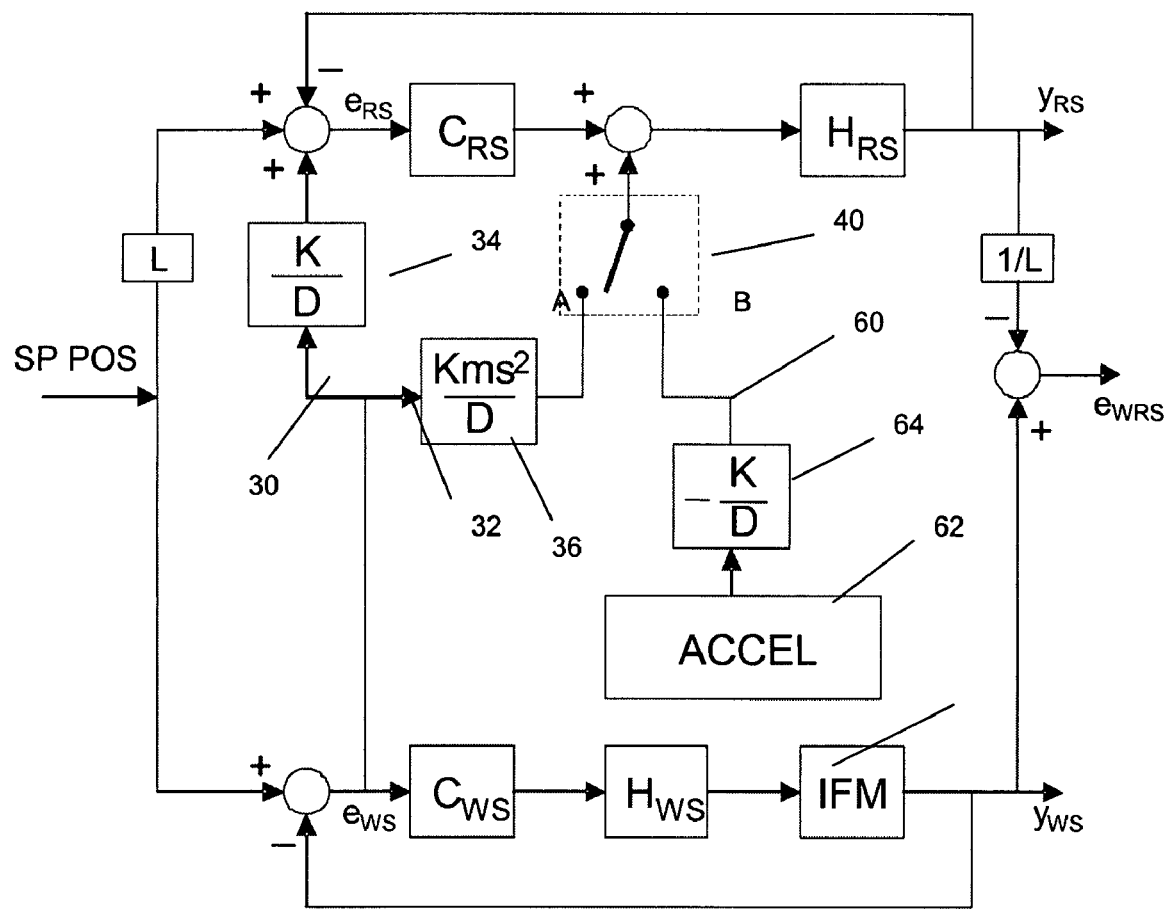
FIG. 6 depicts a block diagram of a substrate and patterning support control system according to an embodiment of the present invention.

Referring to FIG. 6, a lithographic apparatus according to an embodiment of the present invention includes a control system, which differs from the prior art control system depicted in FIG. 3 in that now, among other things, the switch 40 is used to select either the original branch 32 using the substrate support position error $e_{WS}$ and generating an accelerating force for the patterning support MT through the stage 36 having a transfer function $Kms^2/D$ (switch position A), or a branch 60 providing an acceleration signal from an accelerometer 62 coupled to the substrate support WT through a stage 64 having a transfer function $-K/D$ (switch position B).

In the embodiment of FIG. 6, the position B of the switch 40 is used at least in the third time period, and possibly in the second time period, as defined above in relation to FIG. 9 (at substantially constant velocity of the substrate support WT), whereas the position A of the switch 40 is used in other time periods. Using the acceleration signal from the accelerometer 62 through the branch 60 in the position B of the switch 40 considerably reduces the delay in adding the force to the patterning support MT to match the signal from the branch 30 added to the patterning support position error signal $e_{RS}$. The reduction of the delay is due to the fact that no derivative calculation is required, as the acceleration is measured directly, and is not calculated by differentiating a position as in previous embodiments.

Figure 7:
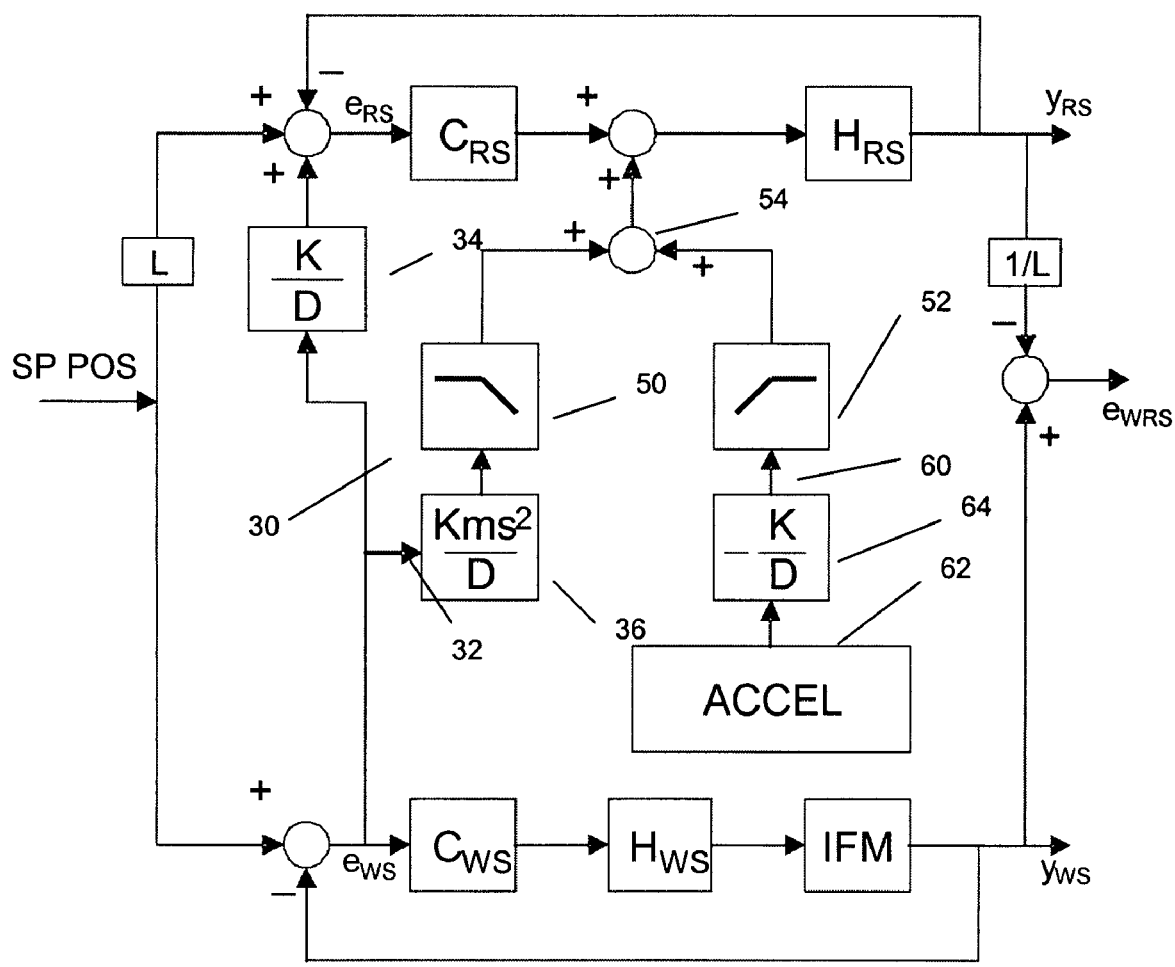
FIG. 7 depicts a block diagram of a substrate and patterning support control system according to an embodiment of the present invention.

Referring to FIG. 7, a lithographic apparatus according to an embodiment of the present invention includes a control system, which differs from the control system depicted in FIG. 6 in that, among other things, the switch 40 of FIG. 6 has been implemented in FIG. 7 by a combination of a low-pass filter 50 and a high-pass filter 52 both having their output coupled to an adder 54. For lower frequencies, the original branch 32 using the substrate support position error $e_{WS}$ and generating an accelerating force for the patterning support MT through the stage 36 having a transfer function $Kms^2/D$ is substantially active, and the branch 60 coupled to the accelerometer 62 through the stage 64 having the transfer function $-K/D$ is substantially inactive. For higher frequencies, the original branch 32 using the substrate support position error $e_{WS}$ and generating an accelerating force for the patterning support MT through the stage 36 having a transfer function $Kms^2/D$ is substantially inactive, and the branch 60 coupled to the accelerometer 62 through the stage 64 having the transfer function $-K/D$ is substantially active. Thus, in the embodiment of FIG. 7, the use of the signal $e_{WS}$ and the acceleration signal from the accelerometer 62 are switched in the frequency domain.

In the embodiment of FIG. 7, high-pass filter 52 filters out the generally low-frequent component caused by the acceleration profile in the absolute acceleration signal. Since the accelerometer 62 generates a representation of the absolute acceleration as opposed to the acceleration error, it contains the acceleration as caused by the scanning motion that the substrate table WT executes. This part of the acceleration should not be transferred to the patterning support MT, and is filtered by high-pass filter 52. Low-pass filter 50 is selected to be a complement of high-pass filter 52. An order, cut-off frequency and damping of the low-pass filter 50 are substantially the same as those of high-pass filter 52. By this selection, zero phase error is introduced in the overall path of the acceleration feedforward to the patterning support MT. Using the accelerometer signal from the accelerometer 62 through the branch 60 considerably reduces the delay in adding the force to the patterning support MT to match the signal from the branch 30 added to the patterning support position error signal $e_{RS}$, because the delay is especially critical for higher frequencies.

Figure 8:
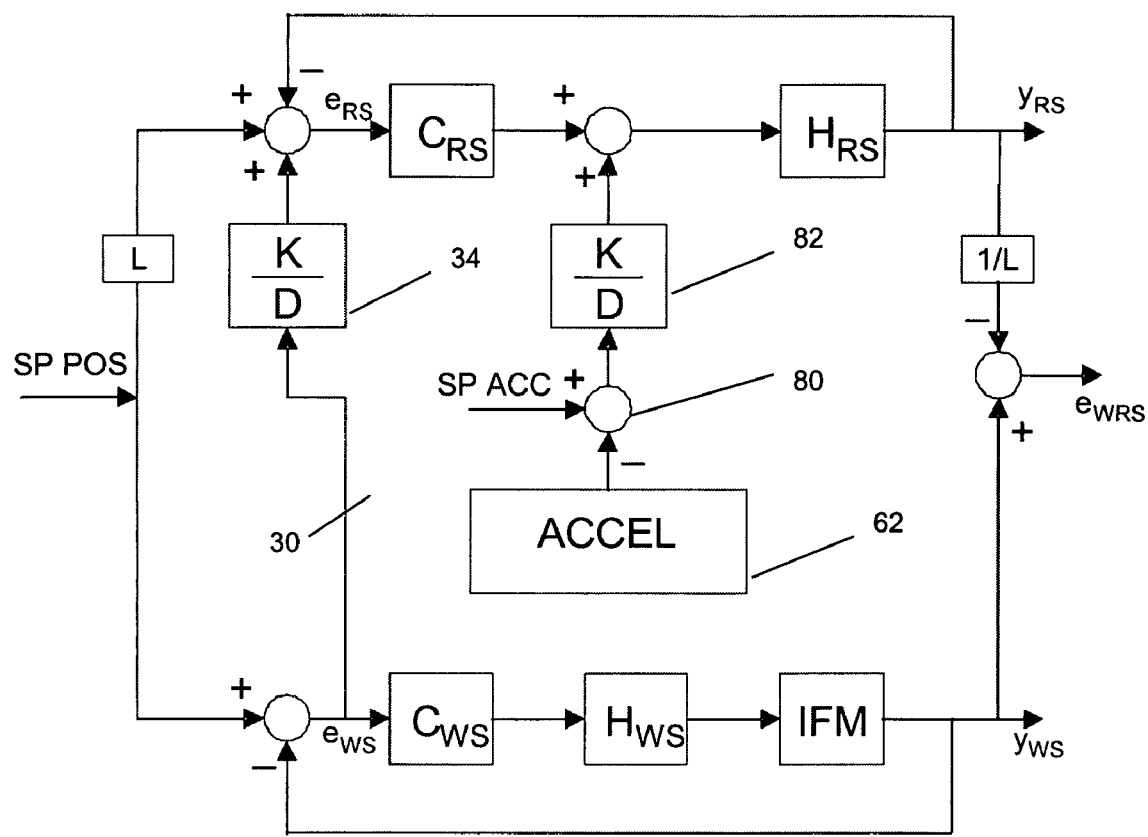
FIG. 8 depicts a block diagram of a substrate and patterning support control system according to an embodiment of the present invention.

Referring to FIG. 8, a lithographic apparatus according to an embodiment of the present invention includes a control system, which differs from the prior art control system depicted in FIG. 3 in that now, among other things, in a comparator 80, an acceleration signal from an accelerometer 62 coupled to the substrate support WT is compared with a setpoint acceleration signal SP ACC provided by a setpoint generator (not shown in detail), resulting in an acceleration error signal for generating an accelerating force for the patterning support MT through a stage 82 having a transfer function $K/D$.

Using the acceleration error signal considerably reduces the delay in adding the force to the patterning support MT to match the signal from the branch 30 added to the patterning support position error signal $e_{RS}$.

According to en embodiment of the invention, it is possible to improve the delay of the feedthrough path in the control of the components of the lithographic apparatus by 0.75 sample, leading to MA improvement of a factor of about four (compared to two in the prior art), and an MSD value improvement of almost a factor two (compared to only a slight improvement in the prior art).

It is to be observed here, that the graphs of FIG. 9 do not only apply to movements of the substrate support WT, but do also apply to movements of the patterning support MT, since such movements are synchronized. Accordingly, a switching condition for the switch 40 may also be derived from operating conditions of the patterning support MT, where the same time periods as described above for the substrate support WT apply.

While in the above the patterning support MT is controlled such that the image positioning as projected by the projection system PS on the substrate W is improved, it is also possible to control another optical component, such as a refractive lens element or a mirror for obtaining an improvement in the positioning of an image. Such an optical element may be a part of the projection system PS, or e.g. a part of the illuminator IL.

In an embodiment of the invention, a computer product may be used to perform at least one of the above methods. The computer product has machine executable instructions, the instructions being executable by a machine to perform at least one of the above methods.

In an embodiment of the invention, a data carrier containing computer code containing computer instructions for a motion computer system of a lithographic apparatus may be used. The instructions are configured to perform at least one of the above methods.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate", "target area", or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program or computer product containing one or more sequences of machine-readable instructions describing a method as disclosed above, or a data storage medium (e.g. semiconductor memory, magnetic or optical disk) having such a computer program stored therein. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

The terms "a" or "an", as used herein, are defined as one or more than one. The term plurality, as used herein, is defined as two or more than two. The term another, as used herein, is defined as at least a second or more. The terms including and/or having, as used herein, are defined as including (i.e., open language). The term coupled, as used herein, is defined as connected, although not necessarily directly, and not necessarily mechanically.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a radiation beam;
a patterning support constructed and arranged to hold a patterning device, the patterning device being capable of imparting the radiation beam with a pattern in its cross-section to form a patterned radiation beam;
a substrate support constructed and arranged to hold a substrate;
a projection system constructed and arranged to project the patterned radiation beam onto a target portion of the substrate;
a first driving device constructed and arranged to move an optical component of the lithographic apparatus;
a second driving device constructed and arranged to move the substrate support so as to be synchronous with the motion of the optical component;
a first position measuring device constructed and arranged to provide a momentary position of the optical component;
a second position measuring device constructed and arranged to provide a momentary position of the substrate support at a first sampling rate;
an optical component position comparator constructed and arranged to compare the measured momentary position of the optical component with a desired momentary position of the optical component to generate an optical component position error signal in accordance with a difference between the two optical component positions;
a substrate support position comparator constructed and arranged to compare the measured momentary position of the substrate support with a desired momentary position of the substrate support to generate a substrate support position error signal in accordance with a difference between the two substrate support positions; and
a correcting device constructed and arranged to adjust the momentary position of the optical component so as to compensate for the difference between the two substrate support positions, the correcting device constructed and arranged to:
add a position error signal, generated from the substrate support position error signal, to the optical component position error signal;
add a force to the optical component creating a motion to match the addition of the position error signal to the optical component position error signal, wherein:
at substantially non-constant velocity of the substrate support, the force is generated from the substrate support position error signal; and
at substantially constant velocity of the substrate support, the force is generated from the momentary position provided by the second position measuring device at a second sampling rate higher than the first sampling rate.

2. The lithographic apparatus of claim 1, wherein the optical component is the patterning support constructed and arranged to hold the patterning device.

3. A lithographic apparatus comprising:
an illumination system configured to condition a radiation beam;
a patterning support constructed and arranged to hold a patterning device, the patterning device being capable of imparting the radiation beam with a pattern in its cross-section to form a patterned radiation beam;
a substrate support constructed and arranged to hold a substrate;
a projection system constructed and arranged to project the patterned radiation beam onto a target portion of the substrate;
a first driving device constructed and arranged to move an optical component of the lithographic apparatus;
a second driving device constructed and arranged to move the substrate support so as to be synchronous with the motion of the optical component;
a first position measuring device constructed and arranged to provide a momentary position of the optical component;
a second position measuring device constructed and arranged to provide a momentary position of the substrate support at a first sampling rate;
an optical component position comparator constructed and arranged to compare the measured momentary position of the optical component with a desired momentary position of the optical component to generate an optical component position error signal in accordance with a difference between the two optical component positions;
a substrate support position comparator constructed and arranged to compare the measured momentary position of the substrate support with a desired momentary position of the substrate support to generate a substrate support position error signal in accordance with a difference between the two substrate support positions; and
a correcting device constructed and arranged to adjust the momentary position of the optical component so as to compensate for the difference between the two substrate support positions, the correcting device constructed and arranged to:
add a position error signal, generated from the substrate support position error signal, to the optical component position error signal;
add a force to the optical component creating a motion to match the addition of the position error signal to the optical component position error signal, wherein:
at frequencies determined by a low-pass filter, the force is generated from the substrate support position error signal; and
at frequencies determined by a high-pass filter, the force is generated from the momentary position provided by the second position measuring device at a second sampling rate higher than the first sampling rate.

4. The lithographic apparatus of claim 3, wherein the optical component is the patterning support constructed and arranged to hold the patterning device.

5. The lithographic apparatus of claim 3, wherein the low-pass filter and the high-pass filter have complementary filter characteristics.

6. The lithographic apparatus of claim 5, wherein at least one of an order, a cut-off frequency and a damping is the same for the low-pass filter and the high-pass filter.

7. A lithographic apparatus comprising:
an illumination system configured to condition a radiation beam;
a patterning support constructed and arranged to hold a patterning device, the patterning device being capable of imparting the radiation beam with a pattern in its cross-section to form a patterned radiation beam;
a substrate support constructed and arranged to hold a substrate;
a projection system constructed and arranged to project the patterned radiation beam onto a target portion of the substrate;
a first driving device constructed and arranged to move an optical component of the lithographic apparatus;
a second driving device constructed and arranged to move the substrate support so as to be synchronous with the motion of the optical component;

a first position measuring device constructed and arranged to provide a momentary position of the optical component;

a second position measuring device constructed and arranged to provide a momentary position of the substrate support at a first sampling rate;

an optical component position comparator constructed and arranged to compare the measured momentary position of the optical component with a desired momentary position of the optical component to generate an optical component position error signal in accordance with a difference between the two optical component positions;

a substrate support position comparator constructed and arranged to compare the measured momentary position of the substrate support with a desired momentary position of the substrate support to generate a substrate support position error signal in accordance with a difference between the two substrate support positions; and a correcting device constructed and arranged to adjust the momentary position of the optical component so as to compensate for the difference between the two substrate support positions, the correcting device constructed and arranged to:

add a position error signal, generated from the substrate support position error signal, to the optical component position error signal;

add a force to the optical component creating a motion to match the addition of the position error signal to the optical component position error signal, wherein:

at substantially non-constant velocity of the substrate support, the force is generated from the substrate support position error signal; and at substantially constant velocity of the substrate support, the force is generated from a measured momentary acceleration of the substrate support.

8. The lithographic apparatus of claim 7, wherein the optical component is the patterning support constructed and arranged to hold the patterning device.

9. The lithographic apparatus of claim 7, wherein the momentary acceleration of the substrate support is measured by an accelerometer coupled to the substrate support.

10. A lithographic apparatus comprising:
an illumination system configured to condition a radiation beam;
a patterning support constructed and arranged to hold a patterning device, the patterning device being capable of imparting the radiation beam with a pattern in its cross-section to form a patterned radiation beam;
a substrate support constructed and arranged to hold a substrate;
a projection system constructed and arranged to project the patterned radiation beam onto a target portion of the substrate;
a first driving device constructed and arranged to move an optical component of the lithographic apparatus;
a second driving device constructed and arranged to move the substrate support so as to be synchronous with the motion of the optical component;
a first position measuring device constructed and arranged to provide a momentary position of the optical component;
a second position measuring device constructed and arranged to provide a momentary position of the substrate support at a first sampling rate;
an optical component position comparator constructed and arranged to compare the measured momentary position of the optical component with a desired momentary position of the optical component to generate an optical component position error signal in accordance with a difference between the two optical component positions;
a substrate support position comparator constructed and arranged to compare the measured momentary position of the substrate support with a desired momentary position of the substrate support to generate a substrate support position error signal in accordance with a difference between the two substrate support positions; and
a correcting device constructed and arranged to adjust the momentary position of the optical component so as to compensate for the difference between the two substrate support positions, the correcting device constructed and arranged to:
add a position error signal, generated from the substrate support position error signal, to the optical component position error signal;
add a force to the optical component creating a motion to match the addition of the position error signal to the optical component position error signal, wherein:
at frequencies determined by a low-pass filter, the force is generated from the substrate support position error signal; and
at frequencies determined by a high-pass filter, the force is generated from a measured momentary acceleration of the substrate support.

11. The lithographic apparatus of claim 10, wherein the optical component is the patterning support constructed and arranged to hold the patterning device.

12. The lithographic apparatus of claim 10, wherein the low-pass filter and the high-pass filter have complementary filter characteristics.

13. The lithographic apparatus of claim 12, wherein at least one of an order, a cut-off frequency and a damping is the same for the low-pass filter and the high-pass filter.

14. A device manufacturing method comprising:
projecting a patterned beam of radiation onto a target portion of a substrate in a lithographic apparatus;
moving an optical component of the lithographic apparatus;
moving a substrate support so as to be synchronous with the motion of the optical component;
measuring a momentary position of the optical component;
measuring a momentary position of the substrate support at a first sampling rate;
comparing the measured momentary position of the optical component with a desired momentary position of the optical component to generate an optical component position error signal in accordance with a difference between the two optical component positions;
comparing the measured momentary position of the substrate support with a desired momentary position of the substrate support to generate a substrate support position error signal in accordance with a difference between the two substrate support positions; and
adjusting the momentary position of the optical component so as to compensate for the difference between the two substrate support positions, the adjustment comprising:
adding a position error signal, generated from the substrate support position error signal, to the optical component position error signal;
adding a force to the optical component creating a motion to match the addition of the position error signal to the optical component position error signal, wherein:

at substantially non-constant velocity of the substrate support, the force is generated from the substrate support position error signal; and at substantially constant velocity of the substrate support, the force is generated from the momentary position of the substrate support measured at a second sampling rate higher than the first sampling rate.

15. A device manufacturing method comprising:

projecting a patterned beam of radiation onto a target portion of a substrate in a lithographic apparatus; moving an optical component of the lithographic apparatus;

moving a substrate support so as to be synchronous with the motion of the optical component;

measuring a momentary position of the optical component;

measuring a momentary position of the substrate support at a first sampling rate;

comparing the measured momentary position of the optical component with a desired momentary position of the optical component to generate an optical component position error signal in accordance with a difference between the two optical component positions;

comparing the measured momentary position of the substrate support with a desired momentary position of the substrate support to generate a substrate support position error signal in accordance with a difference between the two substrate support positions; and adjusting the momentary position of the optical component so as to compensate for the difference between the two substrate support positions, the adjustment comprising:

adding a position error signal, generated from the substrate support position error signal, to the optical component position error signal;

adding a force to the optical component creating a motion to match the addition of the position error signal to the optical component position error signal, wherein:

at frequencies determined by low-pass filtering, the force is generated from the substrate support position error signal; and at frequencies determined by a high-pass filter, the force is generated from the momentary position of the substrate support measured at a second sampling rate higher than the first sampling rate.

16. A device manufacturing method comprising:

projecting a patterned beam of radiation onto a target portion of a substrate in a lithographic apparatus;

moving an optical component of the lithographic apparatus;

moving a substrate support so as to be synchronous with the motion of the optical component;

measuring a momentary position of the optical component;

measuring a momentary position of the substrate support at a first sampling rate;

comparing the measured momentary position of the optical component with a desired momentary position of the optical component to generate an optical component position error signal in accordance with a difference between the two optical component positions;

comparing the measured momentary position of the substrate support with a desired momentary position of the substrate support to generate a substrate support position error signal in accordance with a difference between the two substrate support positions; and adjusting the momentary position of the optical component so as to compensate for the difference between the two substrate support positions, the adjustment comprising:

adding a position error signal, generated from the substrate support position error signal, to the optical component position error signal;

adding a force to the optical component creating a motion to match the addition of the position error signal to the optical component position error signal, wherein:

at substantially non-constant velocity of the substrate support, the force is generated from the substrate support position error signal; and at substantially constant velocity of the substrate support, the force is generated from a measured momentary acceleration of the substrate support.

17. A device manufacturing method comprising:

projecting a patterned beam of radiation onto a target portion of a substrate in a lithographic apparatus;

moving an optical component of the lithographic apparatus;

moving a substrate support so as to be synchronous with the motion of the optical component;

measuring a momentary position of the optical component;

measuring a momentary position of the substrate support at a first sampling rate;

comparing the measured momentary position of the optical component with a desired momentary position of the optical component to generate an optical component position error signal in accordance with a difference between the two optical component positions;

comparing the measured momentary position of the substrate support with a desired momentary position of the substrate support to generate a substrate support position error signal in accordance with a difference between the two substrate support positions; and adjusting the momentary position of the optical component so as to compensate for the difference between the two substrate support positions, the adjustment comprising:

adding a position error signal, generated from the substrate support position error signal, to the optical component position error signal;

adding a force to the optical component creating a motion to match the addition of the position error signal to the optical component position error signal, wherein:

at frequencies determined by a low-pass filter, the force is generated from the substrate support position error signal; and at frequencies determined by a high-pass filter, the force is generated from a measured momentary acceleration of the substrate support.

18. A non-transitory computer readable medium containing computer instructions for a motion computer system of a lithographic apparatus to perform the device manufacturing method of claim 14, 15, 16 or 17.

19. A non-transitory computer readable medium containing computer code containing computer instructions for a motion computer system of a lithographic apparatus to perform the device manufacturing method of claim 14, 15, 16 or 17.

* * * * *